United States Patent
Zrodnikov et al.

(10) Patent No.: US 8,490,419 B2
(45) Date of Patent: Jul. 23, 2013

(54) INTERLOCKED JETS COOLING METHOD AND APPARATUS

(75) Inventors: Volodymyr Zrodnikov, Chico, CA (US); Mikhail Spokoyny, Chico, CA (US)

(73) Assignee: United States Thermoelectric Consortium, Chico, CA (US)

( * ) Notice: Subject to any disclaimer, the term of this patent is extended or adjusted under 35 U.S.C. 154(b) by 591 days.

(21) Appl. No.: 12/859,168

(22) Filed: Aug. 18, 2010

(65) Prior Publication Data

US 2011/0042041 A1    Feb. 24, 2011

Related U.S. Application Data

(60) Provisional application No. 61/274,662, filed on Aug. 20, 2009.

(51) Int. Cl.
*F28C 1/00* (2006.01)
(52) U.S. Cl.
USPC .............................. 62/121; 62/304
(58) Field of Classification Search
USPC .............. 62/121, 64, 259.2, 304, 414, 435, 62/373; 361/699, 122, 123, 689; 165/104.19, 165/80.3, 908, 80.4
See application file for complete search history.

(56) References Cited

U.S. PATENT DOCUMENTS

| | | | |
|---|---|---|---|
| 3,229,763 A | 1/1966 | Rosenblad | |
| 3,961,925 A * | 6/1976 | Rhoad | 62/376 |
| 4,292,016 A * | 9/1981 | Elliott | 425/101 |
| 4,352,273 A * | 10/1982 | Kinsell et al. | 62/87 |
| 4,354,550 A * | 10/1982 | Modahl et al. | 165/133 |
| 4,938,280 A | 7/1990 | Clark | |
| 5,021,924 A | 6/1991 | Kieda | |
| 5,131,233 A | 7/1992 | Cray | |
| 5,170,319 A | 12/1992 | Chu | |
| 5,183,104 A | 2/1993 | Novotny | |
| 5,220,804 A | 6/1993 | Tilton | |
| 5,224,538 A | 7/1993 | Jacoby | |
| 5,269,146 A | 12/1993 | Kerner | |
| RE34,542 E * | 2/1994 | Rockenfeller | 165/104.12 |
| 5,306,948 A * | 4/1994 | Yamada et al. | 257/690 |
| 5,337,579 A * | 8/1994 | Saia et al. | 62/239 |
| 5,349,831 A * | 9/1994 | Daikoku et al. | 62/376 |

(Continued)

OTHER PUBLICATIONS

Ecologence LLC et al, Notification concerning Transmittal of International Preliminary Report on Patentability, PCT/US2010/045984, Mailing date of Mar. 1, 2012.

(Continued)

*Primary Examiner* — Mohammad M Ali
(74) *Attorney, Agent, or Firm* — The Webostad Firm, A Professional Corp.

(57) ABSTRACT

Dissipating heat and apparatus therefor from a heat dissipation surface is described. In an embodiment, first jets are streamed along the heat dissipation surface in a first direction and are spaced apart from one another. Second jets are streamed along the heat dissipation surface in a second direction at least substantially opposite the first direction and spaced apart from one another. Coolant used to provide the first jets and the second jets is exited away from the heat dissipation surface. The first jets and the second jets are offset from one another in a transverse direction with respect to the first direction and the second direction, and the first jets and the second jets pass side-by-side with respect to one another.

31 Claims, 13 Drawing Sheets

U.S. PATENT DOCUMENTS

| | | | |
|---|---|---|---|
| 5,412,536 A | 5/1995 | Anderson | |
| 5,436,501 A * | 7/1995 | Ikeda | 257/714 |
| 5,462,538 A * | 10/1995 | Korpman | 604/372 |
| 5,598,713 A * | 2/1997 | Bartilucci | 62/78 |
| 5,687,577 A * | 11/1997 | Ballard et al. | 62/64 |
| 5,758,418 A | 6/1998 | Chrysler | |
| 5,781,411 A | 7/1998 | Feenstra | |
| 5,831,824 A | 11/1998 | McDunn | |
| 5,846,852 A * | 12/1998 | Limper-Brenner et al. | 438/118 |
| 5,854,092 A * | 12/1998 | Root et al. | 438/106 |
| 5,955,135 A * | 9/1999 | Boucher et al. | 426/492 |
| 6,054,095 A * | 4/2000 | Minato et al. | 266/81 |
| 6,104,610 A * | 8/2000 | Tilton et al. | 361/699 |
| 6,123,999 A * | 9/2000 | Felix et al. | 427/449 |
| 6,141,214 A | 10/2000 | Ahn | |
| 6,173,758 B1 | 1/2001 | Ward et al. | |
| 6,343,012 B1 | 1/2002 | Rife | |
| 6,366,462 B1 | 4/2002 | Chu | |
| 6,401,807 B1 | 6/2002 | Wyler | |
| 6,426,226 B1 * | 7/2002 | Senkan | 506/11 |
| 6,469,898 B1 | 10/2002 | Rouchon | |
| 6,484,521 B2 * | 11/2002 | Patel et al. | 62/171 |
| 6,498,725 B2 * | 12/2002 | Cole et al. | 361/700 |
| 6,650,538 B1 | 11/2003 | Chu | |
| 6,666,260 B2 | 12/2003 | Tantoush | |
| 6,671,172 B2 | 12/2003 | Carter | |
| 6,729,383 B1 | 5/2004 | Cannell et al. | |
| 6,749,901 B1 * | 6/2004 | Ghosh et al. | 427/448 |
| 6,817,405 B2 | 11/2004 | Kamath | |
| 6,820,684 B1 | 11/2004 | Chu | |
| 6,914,782 B2 | 7/2005 | Ku | |
| 6,940,718 B2 | 9/2005 | Gedamu | |
| 6,958,911 B2 * | 10/2005 | Cader et al. | 361/699 |
| 6,973,801 B1 | 12/2005 | Campbell | |
| 6,988,534 B2 | 1/2006 | Kenny | |
| 7,000,684 B2 | 2/2006 | Kenny | |
| 7,037,797 B1 * | 5/2006 | Shooshtarian et al. | 438/308 |
| 7,120,019 B2 | 10/2006 | Foster | |
| 7,299,647 B2 * | 11/2007 | Tilton et al. | 62/259.2 |
| 7,477,513 B1 * | 1/2009 | Cader et al. | 361/699 |
| 7,679,234 B1 * | 3/2010 | Tilton et al. | 310/54 |
| 7,836,706 B2 * | 11/2010 | Tilton et al. | 62/64 |
| 8,044,346 B2 * | 10/2011 | Kostiainen et al. | 250/288 |
| 2003/0011987 A1 | 1/2003 | Chu | |
| 2003/0183368 A1 | 10/2003 | Paradis et al. | |
| 2003/0226371 A1 | 12/2003 | Rini | |
| 2004/0108101 A1 | 6/2004 | Dugas | |
| 2004/0150956 A1 | 8/2004 | Conte | |
| 2005/0047105 A1 | 3/2005 | Gedamu | |
| 2005/0121171 A1 | 6/2005 | Mukasa | |
| 2006/0042825 A1 | 3/2006 | Lu | |
| 2006/0092235 A1 | 5/2006 | Sugahara | |
| 2006/0126296 A1 | 6/2006 | Campbell | |
| 2007/0141453 A1 | 6/2007 | Mahalingam | |
| 2007/0158050 A1 | 7/2007 | Norley | |

OTHER PUBLICATIONS

Ekkad et al., Dimple Enhanced Heat Transfer in High Aspect Ratio Channels, J. Enhanced Heat Trans., 2003, pp. 395-405, vol. 10(4).

Isaev et al., Numerical Analysis of the Jet-Vortex Pattern Flow in a Rectangular Trench, J. Eng. Phys. & Thermophys., 2003, pp. 61-69, vol. 76(1).

Patrick, W. V., Computations of Flow Structures and Heat Transfer in a Dimpled Channel at Low to Moderate Reynolds Number, Apr. 25, 2005, Master's Thesis, Virginia Polytechnic Institute and State University.

Syred et al., Effect of Surface Curvature on Heat Transfer and Hydrodynamics Within a Single Hemispherical Dimple, J. Turbomachinery, Jul. 2001, pp. 609-613, vol. 123.

Ecologence LLC et al, Notification of Transmittal of the International Search Report and the Written Opinion of the International Search Authority, or the Declaration, International Application No. PCT/US2010/045984 Mailing date Apr. 29, 2011.

* cited by examiner

INTERLOCKED JETS COOLING METHOD AND APPARATUS

CROSS-REFERENCE TO RELATED APPLICATIONS

This application claims benefit of priority under 35 U.S.C. §119(e) to U.S. provisional patent application No. 61/274,662, filed Aug. 20, 2009, entitled "Alternate Direction Jet Cooling Method and Apparatus," which is incorporated herein by reference in its entirety for all purposes to the extent that such subject matter is not inconsistent herewith or limiting hereof.

FIELD

One or more embodiments of the invention generally relate to heat transfer and, more particularly, to cooling using offset jets.

BACKGROUND

A continuing trend in the electronics industry, among other industries, is to create more and more compact apparatuses leading to an increase in the power density of such apparatuses. Accordingly, as the power density of such apparatuses increases, there may be a corresponding increase in thermal energy to be dissipated for operability of such apparatuses. The size of such apparatuses, as well as the systems in which they are implemented, may impose additional constraints on the size of heat transfer devices used to transport such heat away. Furthermore, thermal management systems, such as for electronics for example, may be designed with uniformity of temperature distribution of a cooled surface and high heat flux parameters in mind.

The increase in power density of high-heat flux devices can make demands on heat transfer devices more acute. This additional demand on the ability to transport heat is further exacerbated by generally smaller dimensions utilizable for such heat transfer devices. Some examples of high-heat flux devices include microprocessors, graphics processing units, and power handling semiconductors, among other devices.

Some heat transfer devices include passageways or channels by which a medium, such as fluid, is flowed to transport heat away. As a result of an increase in the amount of thermal energy to be transported, complexity associated with such heat transfer devices has increased. This increase in complexity has generally led to an increase in hydrodynamic losses associated with fluid passing through such heat transfer devices. The increase in hydrodynamic losses has generally resulted in an increase in the consumption of energy for operation of the heat transfer devices themselves. Some heat transfer devices may not provide sufficient uniform cooling across a heat dissipation surface, namely insufficient isothermal heat dissipation across a heat dissipation surface, including without limitation at relatively high heat fluxes.

Accordingly, it would be desirable and useful to provide cooling at higher heat fluxes with relatively low hydrodynamic losses and with sufficient uniform temperature distribution over a heat dissipation surface.

BRIEF SUMMARY

One or more aspects generally relate to cooling using offset jets.

An embodiment relates to a method for dissipating heat from a heat dissipation surface. In such an embodiment, first jets are streamed along the heat dissipation surface in a first direction and are spaced apart from one another. Second jets are streamed along the heat dissipation surface in a second direction at least substantially opposite the first direction and spaced apart from one another. Coolant used to provide the first jets and the second jets is exited away from the heat dissipation surface. The first jets and the second jets are offset from one another in a transverse direction with respect to the first direction and the second direction, and the first jets and the second jets pass side-by-side with respect to one another.

Another embodiment relates to an apparatus for dissipating heat. In such an embodiment a heat sink defines a chamber. The heat sink has a base, a top, a first sidewall, a second sidewall, a third sidewall, and a forth sidewall all having surfaces bordering the chamber. The first sidewall has a first inlet, a first cavity, and first nozzles. The first inlet extends through a portion of the first sidewall to the first cavity for passage of coolant. The first nozzles extend through another portion of the first sidewall from the first cavity for jetting out the coolant from the first nozzles into the chamber. The second sidewall has a second inlet, a second cavity, and second nozzles. The second inlet extends through a portion of the second sidewall to the second cavity for passage of the coolant. The second nozzles, which are offset from the first nozzles in a transverse direction, extend through another portion of the second sidewall from the second cavity for jetting out the coolant from the second nozzles into the chamber. The base is associated with the first sidewall, the second sidewall, the third sidewall, and the fourth sidewall. The base has a heat transfer surface at the bottom of the chamber from which heat is to be dissipated during operation. The top is associated with the first sidewall, the second sidewall, the third sidewall, and the fourth sidewall. The top has an outlet for passage of the coolant out of the chamber. An underside of the base is used to conduct heat to the coolant in the chamber of the heat sink via the heat transfer surface of the base.

Yet another embodiment relates to another apparatus for dissipating heat. In such an embodiment, a heat sink defines a region. The heat sink has a base, a first sidewall, a second sidewall, a third sidewall, and a forth sidewall all of which have surfaces bordering the region. The first sidewall has a first inlet, a first cavity, and first nozzles. The first inlet extends through a portion of the first sidewall to the first cavity for passage of coolant. The first nozzles extend through another portion of the first sidewall from the first cavity for jetting out the coolant from the first nozzles into the region. The second sidewall has a second inlet, a second cavity, and second nozzles. The second inlet extends through a portion of the second sidewall to the second cavity for passage of the coolant. The second nozzles, which are offset in a transverse direction from the first nozzles, extend through another portion of the second sidewall from the second cavity for jetting out the coolant from the second nozzles into the region. The base, which is associated with the first sidewall, the second sidewall, the third sidewall, and the fourth sidewall, has an opening for receipt of a heat dissipation surface.

Still yet another embodiment relates to yet another apparatus for dissipating heat. In such an embodiment, a heat sink defines a region. The heat sink has a first sidewall and a second sidewall bordering the region. The first sidewall has a first cavity and has first nozzles formed through a portion of the first sidewall to the first cavity for passage of coolant from the first cavity for jetting out from the first nozzles into the region. The second sidewall has a second cavity and has second nozzles formed through a portion of the second sidewall to the second cavity for passage of the coolant from the second cavity for jetting out from the second nozzles into the region. A heat dissipation surface located at the bottom of the region. The first sidewall and the second sidewall face one another. The first nozzles and the second nozzles are pointed in different directions at least substantially opposite one another. The first nozzles and the second nozzles are offset from one another in a transverse direction to facing surfaces of the first sidewall and the second sidewall for providing interlocked jets along the heat dissipation surface during operation."

BRIEF DESCRIPTION OF THE DRAWING(S)

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items; however, in alternative embodiments the items may be different. Furthermore, though particular numerical values and numbers of jets are described herein for purposes of clarity by way of example, it should be understood that the scope of the description is not limited to these particular numerical examples as other values and numbers of jets may be used.

Figure 1:
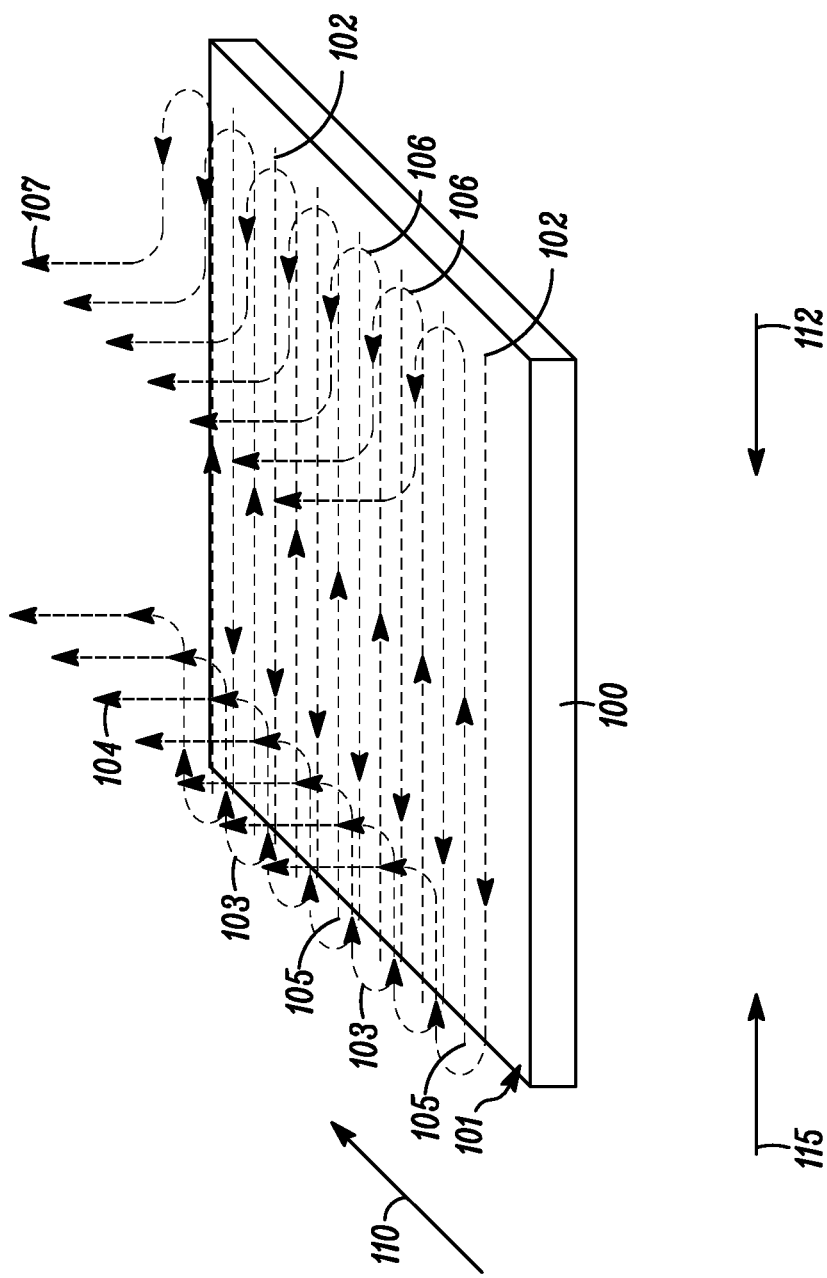
FIG. 1 is a top-down perspective view depicting an exemplary embodiment of a block having a heat dissipation surface.

FIG. 1 is a top-down perspective view depicting an exemplary embodiment of a block 100 having a heat dissipation surface 101. Block 100 generally represents any device having a surface from which heat is to be dissipated. For example, block 100 may be a base of a heat sink, an integrated circuit chip, a component of a condenser, or other component or device.

Jets 102, as generally indicated by dashed lines with arrows, are provided along heat dissipating surface 101 in a direction 112. Jets 102 are spaced apart from one another in at least a substantially transverse direction 110 with respect to direction 112. Jets 102 may encounter an associated distal sidewall causing a deflection from such sidewall, as generally indicated by curved dashed lines with arrows 103. Coolant used to provide jets 102 may be exited away from heat dissipation surface 101, as generally indicated by dashed lines with arrows 104.

Jets 105, as generally indicated by dashed lines with arrows, are provided along heat dissipation surface 101 in a direction 115. Direction 115 may be at least substantially opposite with respect to direction 112. Jets 105 are spaced apart from one another in at least a substantially transverse direction 110 with respect to direction 115. In this exemplary embodiment, jets 105 are located at least substantially centered between jets 102; however, embodiments without such central positioning may be used.

Like jets 102, jets 105 may encounter an associated distal sidewall causing a deflection, as generally indicated by curved dashed lines with arrows 106, and coolant used to provide jets 105 may be exited away from heat dissipation surface 101, as generally indicated by dashed lines with arrows 107. By shifting or offsetting jets 102 and 105 from one another in at least a substantially transverse direction 110, it should be appreciated that jets 102 and 105 may be interlocked. More generally, jets 102 and 105 may be located side-by-side one another, with or without some amount of side-to-side contact, moving in directions 112 and 115, respectively.

For example, by having interlocked jets 102 and 105 from at least substantially opposing sides of heat dissipation surface 101, heat transfer from heat dissipation surface 101 to coolant used to provide jets 102 and 105 may be obtained. Jets 102 and 105 may be sized and positioned, as may vary from application-to-application, to make overall heat dissipation across heat dissipation surface 101 sufficiently isothermal. It should further be understood that by having interlocking jets 102 and 105, relatively high heat fluxes with low hydrodynamic loses may be obtained, in comparison to conventional liquid coolant heat sinks. The particular heat fluxes and hydrodynamic loses obtained may vary from application-to-application.

Coolant used to provide jets 102 and 105 may be a liquid, a gas, or a gas-liquid mixture. In some embodiments, coolant used to provide jets 102 and 105 may be a dielectric liquid. A single-phase cooling may be used. Furthermore, a two-phase cooling or other multiphase cooling may be used. For example for water cooling, water and sub-cooled boiling water cooling may be used in two-phase cooling.

Jets 102 and 105 are illustratively depicted in FIG. 1 as not being channelized, namely there is no physical barrier limiting the path of jets 102 and 105 across heat dissipation surface 101, such physical barriers may be implemented in other embodiments for channeled cooling as described below in additional detail. Jets 102 and 105 may, though need not, extend across the entire length of heat dissipation surface 101, as may vary depending on application.

However, jets 102 and 105, prior to being deflected by respective distal sidewalls, generally extend along at least a substantial portion of the entire length of heat dissipation surface 101 as illustratively depicted. By extend along heat dissipation surface 101, it should be understood that such streams may or may not directly contact heat dissipation surface 101 along some areas thereof. Generally, jets 102 and 105 are emitted above heat dissipation surface; however, as jets 102 and 105 progressively expand in diameter, such jets may or may not directly contact heat dissipation surface 101 along some areas thereof, as may vary from application-to-application. In other embodiments, at least one jet of either or both jets 102 and 105 may be inclined to contact heat dissipation surface 101, as described below in additional detail.

Thus, as described herein for purposes of clarity and not limitation, the term "along" is meant to refer to a jet going from one side toward another side of a heat dissipation surface to include without limitation contacting and/or not contacting such heat dissipation surface.

Again, in the embodiment of FIG. 1, jets 102 and 105 are not channeled. In other words, there are no physical barriers keeping jets 102 and 105 from contacting one another other than orientation of nozzles, as described below in additional detail. It should be understood that in a non-channeled embodiment, jets 102 and 105 may or may not collide side-to-side with one another, at least in a glancing, grazing or tangential manner. At least one jet of jets 102 and at least one jet of jets 105 may collide side-to-side with one another, where pairs of jets from opposite directions may collide side-to-side with one another.

With reference to FIG. 1, it should be appreciated that a central core of jets 102 and 105 may extend above heat dissipation surface 101 and in combination may define a plane that is substantially coplanar with heat dissipation surface 101. Furthermore, in some embodiments, jets 102 from one side may correspond in number to jets 105 from another to provide pairs of alternate jets. However, such correspondence may not be present in other embodiments.

Figure 2:
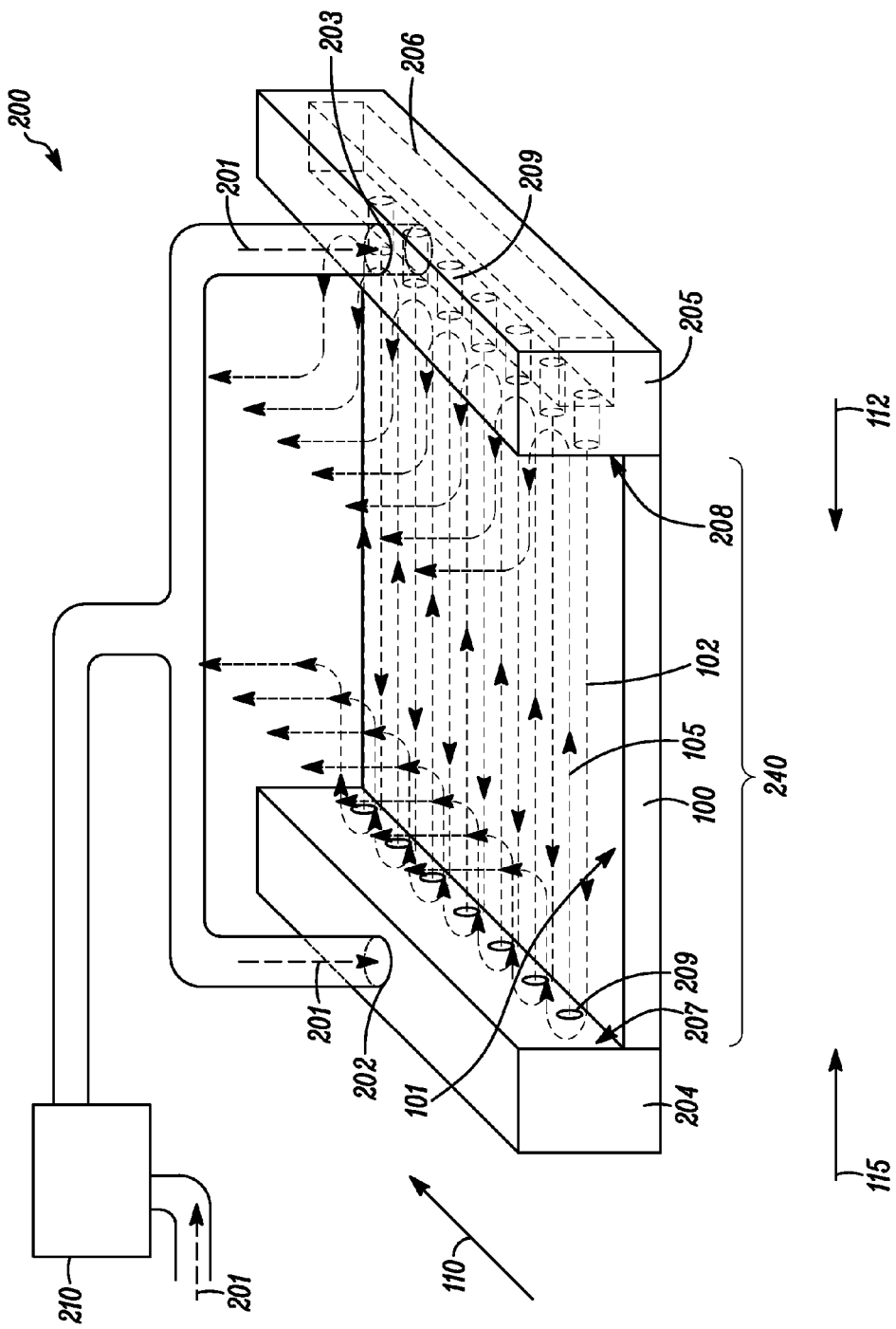
FIG. 2 is a perspective view depicting an exemplary embodiment of a heat transfer system.

FIG. 2 is a perspective view depicting an exemplary embodiment of a heat transfer system 200. In heat transfer system 200, coolant 201 is provided to pump 210. Pump 210 pumps coolant 201 into left and right manifolds 204 and 205 via respective inlets 202 and 203. Inlets 202 and 203 provide passageways to internal cavities of each of manifolds 204 and 205. Each of manifolds 204 and 205 include nozzles 209 providing passageways from respective internal cavities to a region 240. For purposes of clarity by way of example and not limitation, only internal aspects of manifold 205 are described in additional detail as such description equally applies to manifold 204. Furthermore, even though cylindrical nozzles are illustratively depicted in the several figures hereof, it should be understood that nozzles described herein may have any of a variety of geometric shapes, including without limitation cylinders.

Manifold 205 includes cavity 206, which is coupled to receive coolant 201 via inlet 203. Cavity 206 in manifold 205 likewise has nozzles 209 coupled to such cavity 206. Nozzles 209 are coupled to cavity 206 for allowing the passage of coolant 201 from cavity 206 to region 240. Jets 102 are respectively emitted or jet out from nozzles 209 of manifold 205, and jets 105 are respectively emitted or jet out from nozzles 209 of manifold 204. Jets 102 and 105 respectively jet out from manifolds 205 and 204 into region 240.

In an embodiment where jets 102 and 105 are formed of a liquid coolant, region 240 may be a chamber partly defined by sidewalls 207 and 208 respectively of manifolds 204 and 205, and heat dissipation surface 101. Other sidewalls and a top of such chamber 240 are not illustratively depicted in FIG. 2.

In an embodiment where jets 102 and 105 are formed of a gas coolant, such as air for example, region 240 may be an open air region, may have other sidewalls, or may have other sidewalls and a top with one or more outlets.

As previously described, jets 102 and 105 pass along heat dissipation surface 101, which in this exemplary embodiment is generally at the bottom of region 240; however, such orientation need not be used. For example, manifolds 204 and 205 may be rotated 90 or 180 degrees, or some other angle, for use thereof.

It should be understood that sidewalls 207 and 208 at least substantially face one another, whether being exactly parallel to one another or not. Nozzles 209 of manifold 205 are pointed in direction 112 and nozzles 209 of manifold 204 are pointed in direction 115. Directions 112 and 115 may be opposite one another, or at least substantially opposite one another. It should further be understood that nozzles 209 of manifold 204 are offset from nozzles 209 of manifold 205 in transverse direction 110 so as to allow for interlocking jets 102 and 105 along heat dissipation surface 101 during operation of system 200.

Figure 3:
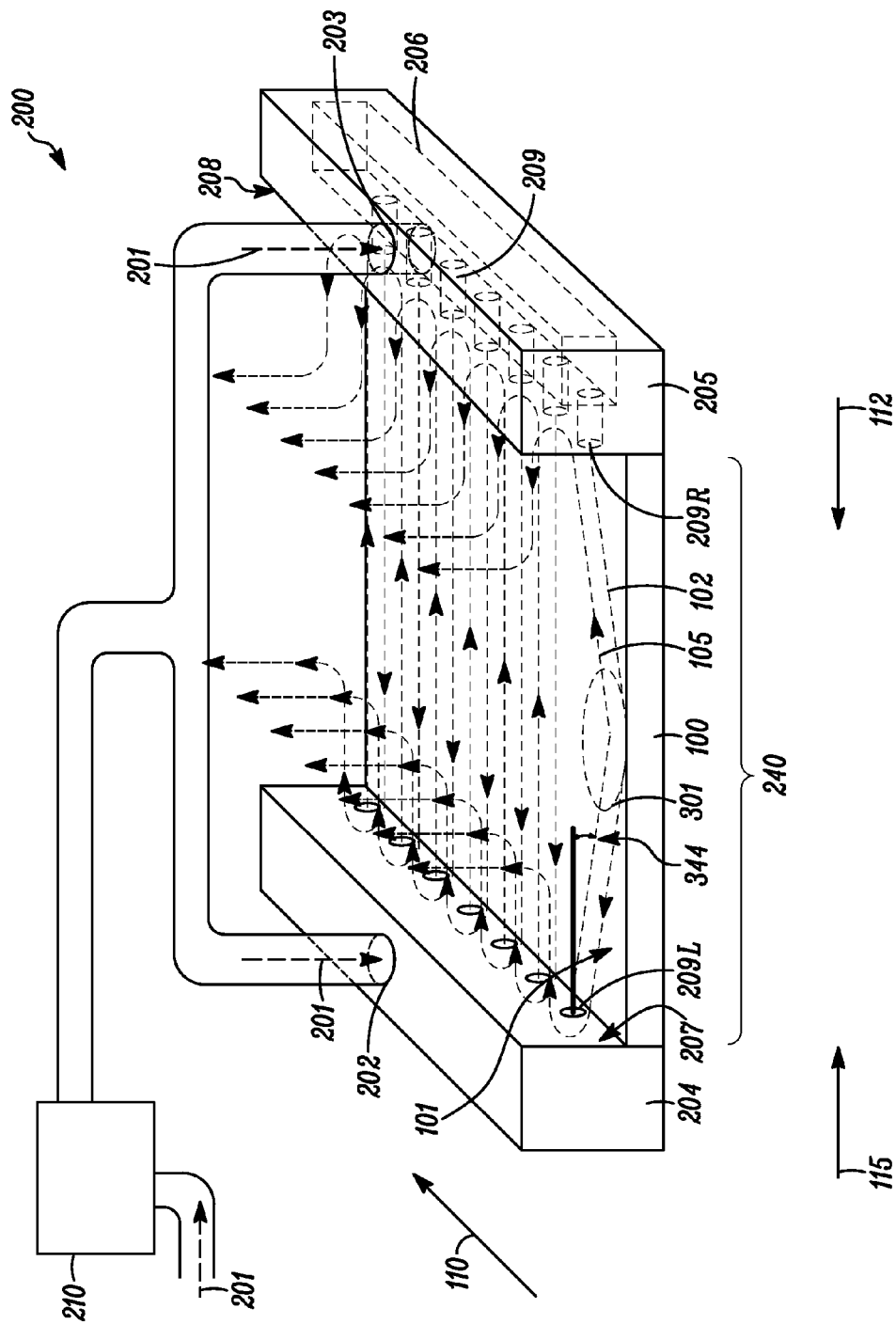
FIG. 3 is the perspective view of FIG. 2, except with two nozzles pointed to at least have a more direct contact with a heat dissipation surface.

FIG. 3 is the perspective view of FIG. 2, except with two nozzles 209R and 209L pointed to ensure some contact, namely a more direct contact, with heat dissipation surface 101. In this exemplary embodiment, nozzle 209R is pointed at a surface area of heat dissipation surface 101 such that jet 102 deflects off of heat dissipation surface 101. Jet 102 after deflecting off of heat dissipation surface 101 continues its path toward sidewall 207 of manifold 204 before being deflected off of such sidewall. The surface area, such as area 301, may be a hot spot of heat dissipation surface 101.

Nozzle 209L likewise is pointed to have jet 105 contact in an area 301 of heat dissipation surface 101. After making contact in area 301 of heat dissipation surface 101, jet 105 continues toward sidewall 208 of manifold 205 before begin deflected off such sidewall. These two nozzles from opposite sides are illustratively depicted as being used for more directly cooling a hot spot, namely such as area 301. It should be understood that a single nozzle may be pointed at a hot spot from a single side, or more than two nozzles from opposite or same sides may be pointed at an area or areas of heat dissipation surface 101.

Thus, it should be understood that jets 102 and 105 may pass side-by-side, at parallel (i.e., 0 degrees) or other angled orientations. Furthermore, it should be understood that jets 102 and 105 are illustratively depicted as being provided in alternating pairs. In other words, interlocking jets alternate in direction such that one jet for example is projected from a right side followed by a next jet projected from a left side. Thus, pairs of interlocked jets alternately directed may be used during operation. However, even though pairs of alternately directed interlocked jets are illustratively depicted, it should be understood that pairing of alternately directed interlocked jets need not be used. For example, other sequences of providing jets from one side and another may be used.

An angle of inclination 344 from horizontal for a jet 105 is identified. An angle of inclination for an angled jet is not illustratively identified, but may be the same or a different angle from horizontal than angle 344. The angle or angles of inclination of jets 102 and 105 to an area 301 on heat dissipation surface 101 may vary from application-to-application. Generally, such angles may be in a range of approximately 1 to 45 degrees. However, such angles may in other embodiments be in a narrower range, such as of approximately 1 to 30 degrees. While not wishing to be bound by theory, it is generally believed that smaller angles of inclination may yield higher heat fluxes.

Figure 4:
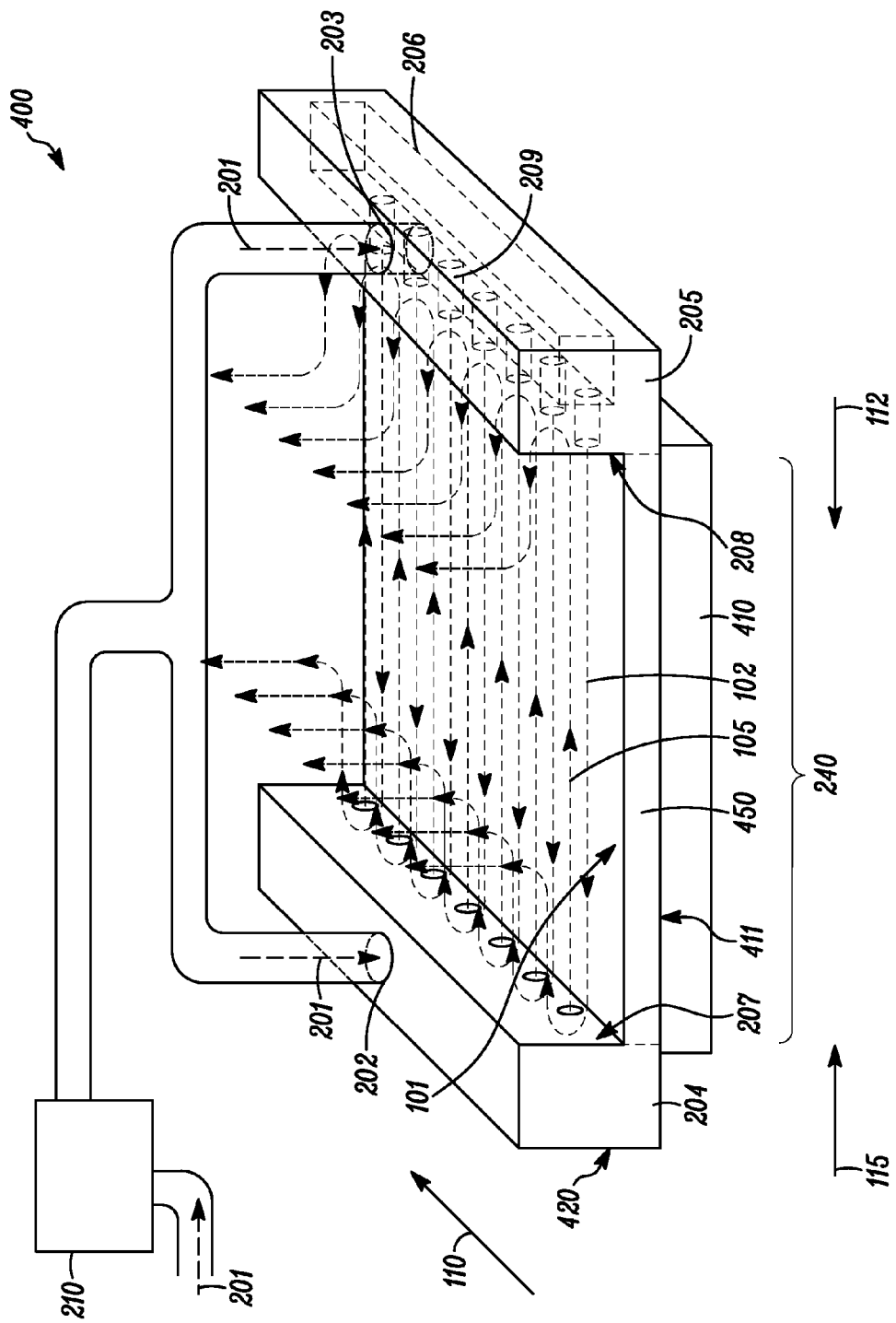
FIG. 4 is a perspective view depicting an exemplary embodiment of a heat sink of a system.

FIG. 4 is a perspective view depicting an exemplary embodiment of a heat sink 420 of a system 400. Heat sink 420 of FIG. 4 is illustratively depicted as being in thermal contact with an object 410. Object 410 may be any component or device having a surface from which heat is to be dissipated. In this exemplary embodiment, a base portion 450 of heat sink 420 has an underside 411 to which a heated surface of object 410 is coupled for thermal conduction. Such coupling may be by paste, gravity, friction, weld, glue, epoxy, or other form for coupling, or a combination thereof.

Heat from a heated surface of object 410 is thermally conducted through base portion 450 to heat dissipation surface 101 for transfer into coolant provided as jets from manifolds 204 and 205 as previously described. In FIG. 4, two sides and a top of heat sink 420 are not shown for purposes of clarity. However, it should be understood that region 240 may be a chamber.

In chamber 240, coolant may temporarily reside before exiting heat sink 420. Thus, jets 102 and 105 may be projected into chamber 240 as submerged in coolant 201.

Figure 5:
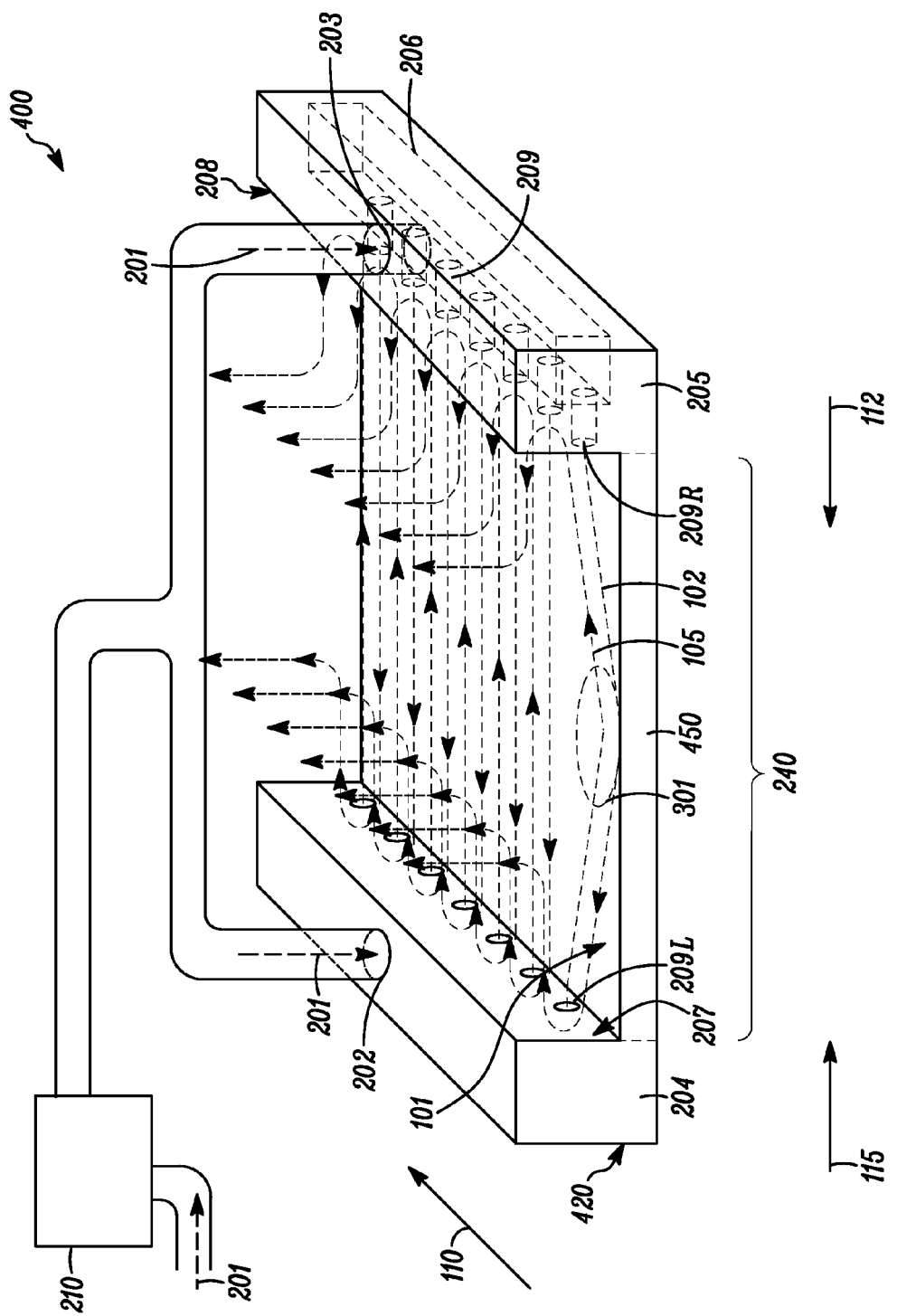
FIG. 5 is a perspective view depicting another exemplary embodiment of heat sink of system.

FIG. 5 is a perspective view depicting another exemplary embodiment of heat sink 420 of system 400. In this embodiment, heat sink 420 is effectively a combination of heat sink 420 of FIG. 4 with the inclined nozzles 209R and 209L of FIG. 3. Accordingly, it should be understood that heat sink 420 may be formed with one or more incline nozzles, as previously described.

Figure 6:
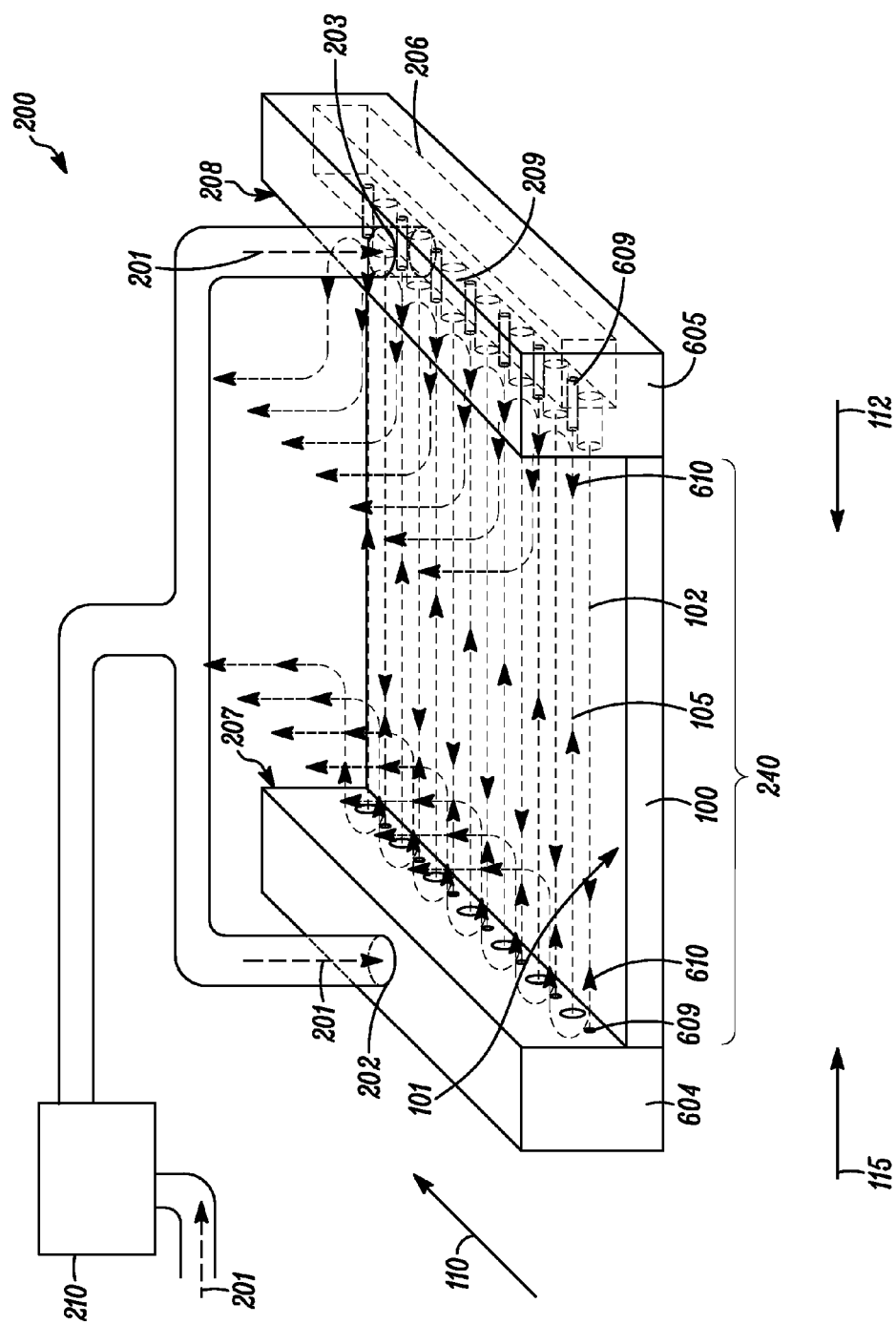
FIG. 6 is perspective view depicting an exemplary embodiment of the system of FIG. 3 with manifolds having nozzles for helper jets.

FIG. 6 is perspective view depicting an exemplary embodiment of system 200 of FIG. 3 with manifolds 604 and 605 respectively replacing manifolds 204 and 205 of FIG. 2. As much of the description for FIG. 6 has already been described with reference to FIG. 2, generally only the differences are described below for purposes of clarity. Furthermore, it should be appreciate that manifolds 604 and 605 may be used in a heat sink, such as heat sink 420 in FIGS. 4 and 5 for example, in place of manifolds 204 and 205 thereof.

Manifolds 604 and 605 are similar to manifolds 204 and 205, except with the following differences. Manifolds 604 and 605 include additional nozzles 609. For purposes of clarity, only manifold 605 is further described, as such description equally applies to manifold 604.

Manifold 605 receives coolant 201 from inlet 203, as previously described, into cavity 206, as previously described. Coolant is passed from cavity 206 to region 240 via nozzles 209 and nozzles 609. Nozzles 609 may correspond in number to nozzles 209, except nozzles 609 are generally smaller in diameter than nozzles 209. Furthermore, nozzles 609 may be aligned in transverse direction 110 to nozzles 209 on opposite sides of heat dissipation surface 101.

Nozzles 609 may be used for providing jets 610 that do not extend as far along heat dissipation surface 101 as jets 102 and 105. In other words, because jets 102 and 105 in some embodiments may not be sufficiently strong as to extend the entire length of heat dissipation surface 101, helper jets 610 from nozzles 609 may be used to make up the difference for cooling generally along edges of heat dissipation surface 101, namely for cooling heat dissipation surface at the distal ends of the paths of jets 102 and 105. Jets 610 from nozzles 609 may extend only a sufficient distance for providing more uniform cooling, namely a distance not sufficiently covered by jets 102 and 105. Furthermore, jets 610 may likewise be offset from one another in transverse direction 110 and may likewise be directed in directions 115 and 112. Thus, jets 610 may directly oppose, and in some embodiments, directly collide with, their corresponding counterpart jets 102 and 105. Furthermore, one or more nozzles 609 may be inclined toward heat dissipation surface 101, even though not illustratively shown in FIG. 6.

Figure 7:
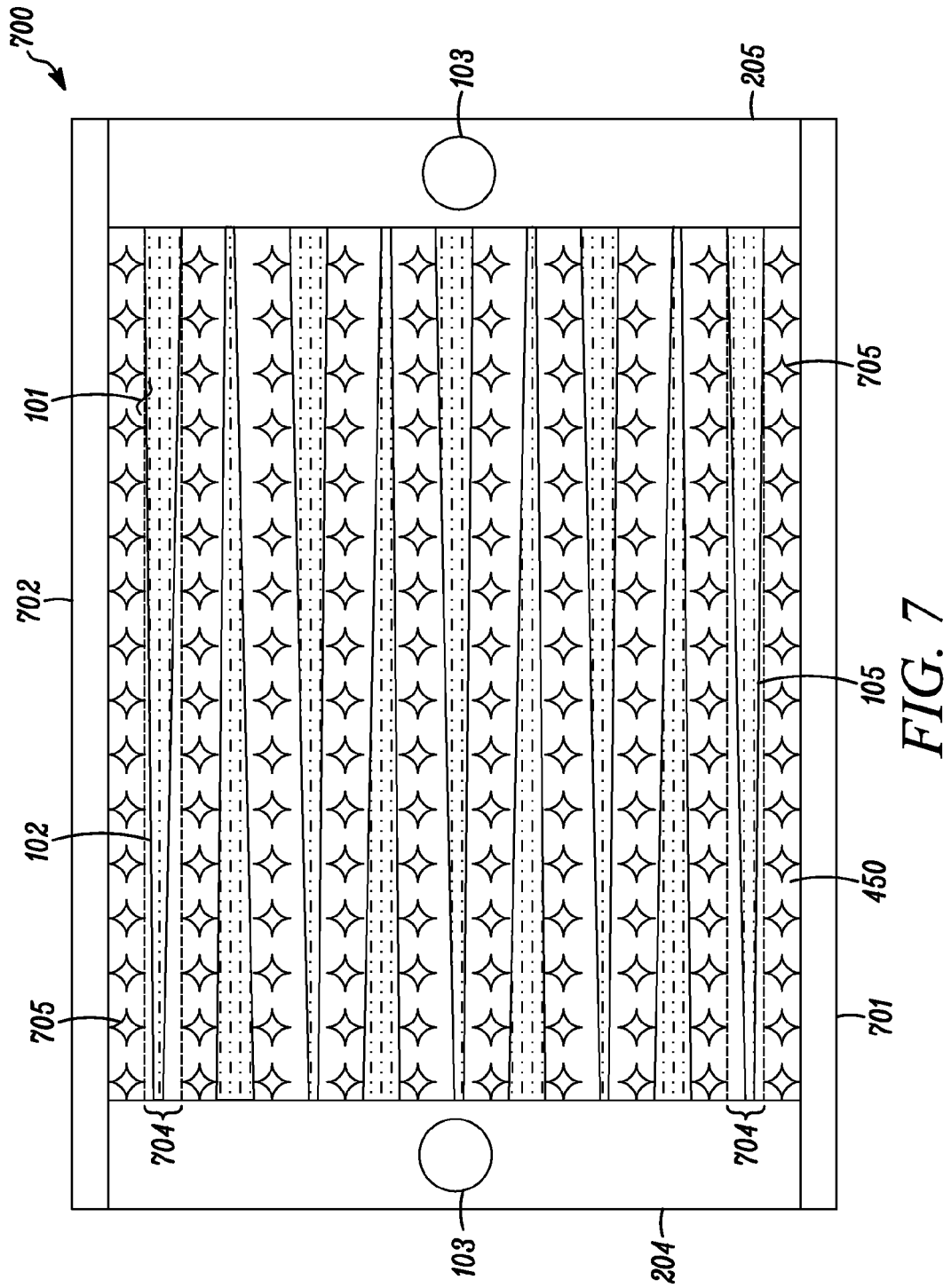
FIG. 7 is a top down view depicting an exemplary embodiment of a heat sink.

FIG. 7 is a top down view depicting an exemplary embodiment of a heat sink 700. Heat sink 700 may be a variation of heat sink 420 of FIGS. 4 and 5, and thus generally only the differences are described for purposes of clarity. FIG. 7 is further described with simultaneous reference to FIGS. 2, 4, and 5.

A top of heat sink 420 is removed for purposes of clarity; however, in this view sidewalls 701 and 702 are illustratively depicted along with sidewalls of 207 and 208 respectively of manifolds 204 and 205. Extending away from heat dissipation surface 101 of a base or base portion ("base") of heat sink 700 are protrusions 705. Such protrusions may be formed as pins with fins ("pin-fins"). Such pin-fins 705 may be star pins as described in U.S. Pat. No. 7,578,337. Base 450 and pin-fins 705 may be integrally formed, or pin-fins 705 may be coupled to heat dissipation surface 101 of base 450.

In this exemplary embodiment, pin-fins 705 are positioned in rows and columns. Even though a generally uniform spacing is illustratively depicted, a non-uniform spacing may be used. Furthermore, even though the number and position of pin-fins 705 generally consumes all area of heat dissipation surface 101 without having pin-fins overlap with one another, a more sparse population of pin-fins may be used. Additionally, even though pin-fins 705 are illustratively depicted as not touching one another, two or more pin-fins 705 may be formed to touch one another so as to constrain or otherwise direct coolant flow within chamber 240.

In this exemplary embodiment, spacing apart of pin-fins 705 from one another allows for coolant flow in directions 110, 112, and 115, among others. Moreover, rows of pin-fins 705 define channels 704. Jets 102 and 105 may be projected into corresponding channels 704. Even though one jet per channel is illustratively depicted, it should be understood that more than one jet per channel may be used.

As jets 102 and 105 travel through channels 704, such jets become progressively wider as illustratively depicted. Thus, jets 102 and 105 at their proximal or origin end may be substantially narrower than at their distal or destination end. Channels 704 may be sufficiently wide, in other words rows of pin-fins 705 may be spaced apart a sufficient amount, such that jets 102 and 105 toward the destination leg of their journey only tangentially contact, glancingly contact or graze fins of pin-fins 705. However, even though channels 704 are illustratively depicted as being sufficiently wide for tangential or glancing contact as previously described, channels 704 may be wider such as to avoid contact with jets 102 and 105 entirely. Furthermore, channels 704 may be narrower for more oblique contact with fins of pin-fins 705. Channel width may vary from application-to-application, and the amount or degree of diameter widening of jets over distance, as well as the diameter of jets at nozzle outlet, may vary from application-to-application.

Figure 8:
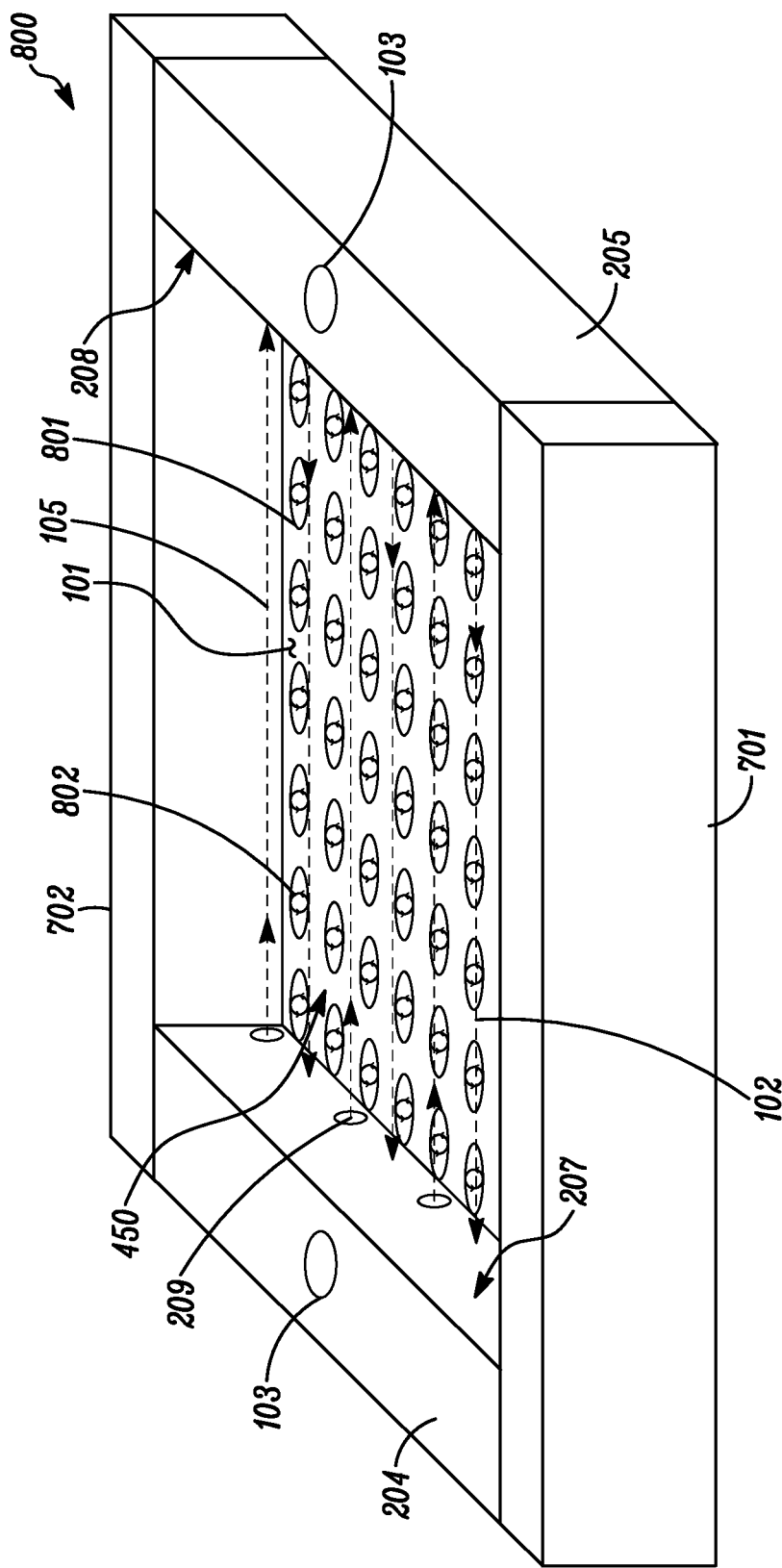
FIG. 8 is a perspective view depicting another exemplary embodiment of a heat sink.

FIG. 8 is a perspective view depicting an exemplary embodiment of a heat sink 800. Heat sink 800 may be a variation of heat sink 420 of FIGS. 4 and 5, and thus generally only the differences are described for purposes of clarity. FIG. 8 is further described with simultaneous reference to FIGS. 2, 4, and 5.

Sidewalls 701 and 702 in combination with sidewalls 207 and 208 and heat dissipation surface 101 partly define a chamber 240. A top is not depicted in FIG. 8 for purposes of clarity.

Formed in heat dissipation surface 101 of base 450 are dimples or truncated dimples 801. In this exemplary embodiment, dimples 801 are positioned in rows and columns. Even though a generally uniform spacing is illustratively depicted, a non-uniform spacing may be used. Furthermore, even though the number and position of dimples 801 generally consumes all area of heat dissipation surface 101 without having dimples overlap with one another, a sparser or denser population of dimples may be used. Additionally, even though dimples 801 are illustratively depicted as not touching one another, two or more dimples 801 may be formed to touch or overlap with one another.

In this exemplary embodiment, rows of dimples 801 are aligned with the paths of jets 102 and 105. Passing jets 102 and 105 over or in into, such as glancingly into, dimples 801 promotes turbulence of coolant within chamber 240. More particularly, such passage of jets 102 and 105 proximate to dimples 801 may promote vortices 802. Vortices 802 may generally at least originate within dimples 801 and may extend upward therefrom.

Figure 9A:
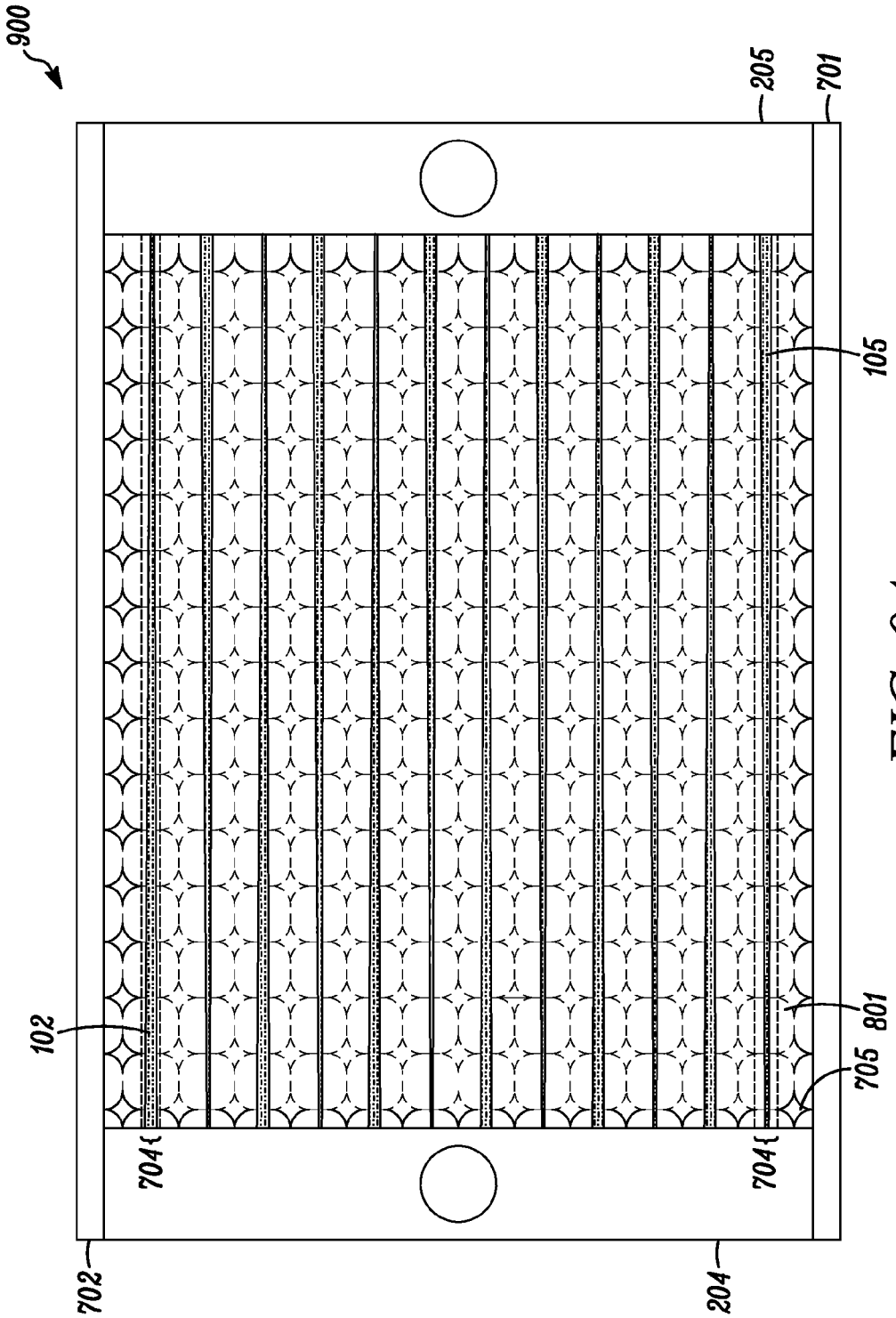
FIG. 9A is a top down view depicting yet another exemplary embodiment of a heat sink.

FIG. 9A is a top down view depicting an exemplary embodiment of a heat sink 900 with jets 102 and 105. Heat sink 900 includes sidewalls 701 and 702 and manifolds 204 and 205. A top of heat sink 900 is omitted for purposes of clarity. Heat sink 900 may be a variation of heat sink 420 of FIGS. 4 and 5 as a combination of heat sinks 700 and 800 of FIGS. 7 and 8, and thus generally on the differences in the figures are described for purposes of clarity. FIG. 9A is further described with simultaneous reference to FIGS. 2, 4, 5, 7 and 8.

Heat sink 900 includes rows of pin fins 705 and rows of dimples 801, wherein rows of pin fins 705 alternate with rows of dimples 801. Again, other orientations and/or spacings may be used.

In this embodiment, dimples 801 are located in channels 704 defined by rows of pin-fins 705. In an embodiment, dimples 801 and pin-fins 705 may be formed together by drilling into a block of material leaving a base 450 with pin-fins 705 and dimples 801. However, other methods of forming dimples and pin-fins may be used within the scope of this disclosure.

Jets 102 and 105 and thus pointing of associated nozzles may be aimed to be within channels 704 defined by rows of pin fins 705. Furthermore, such jets 102 and 105 may be aligned to rows of dimples 801 as previously described. Again, passing of jets 102 and 105 over rows of dimples 801 may promote vortices. However, in this exemplary embodiment, jets 102 and 105 and corresponding dimples 801 may promote of two vortices per dimple as described in additional detail with reference to FIG. 9B.

Figure 9B:
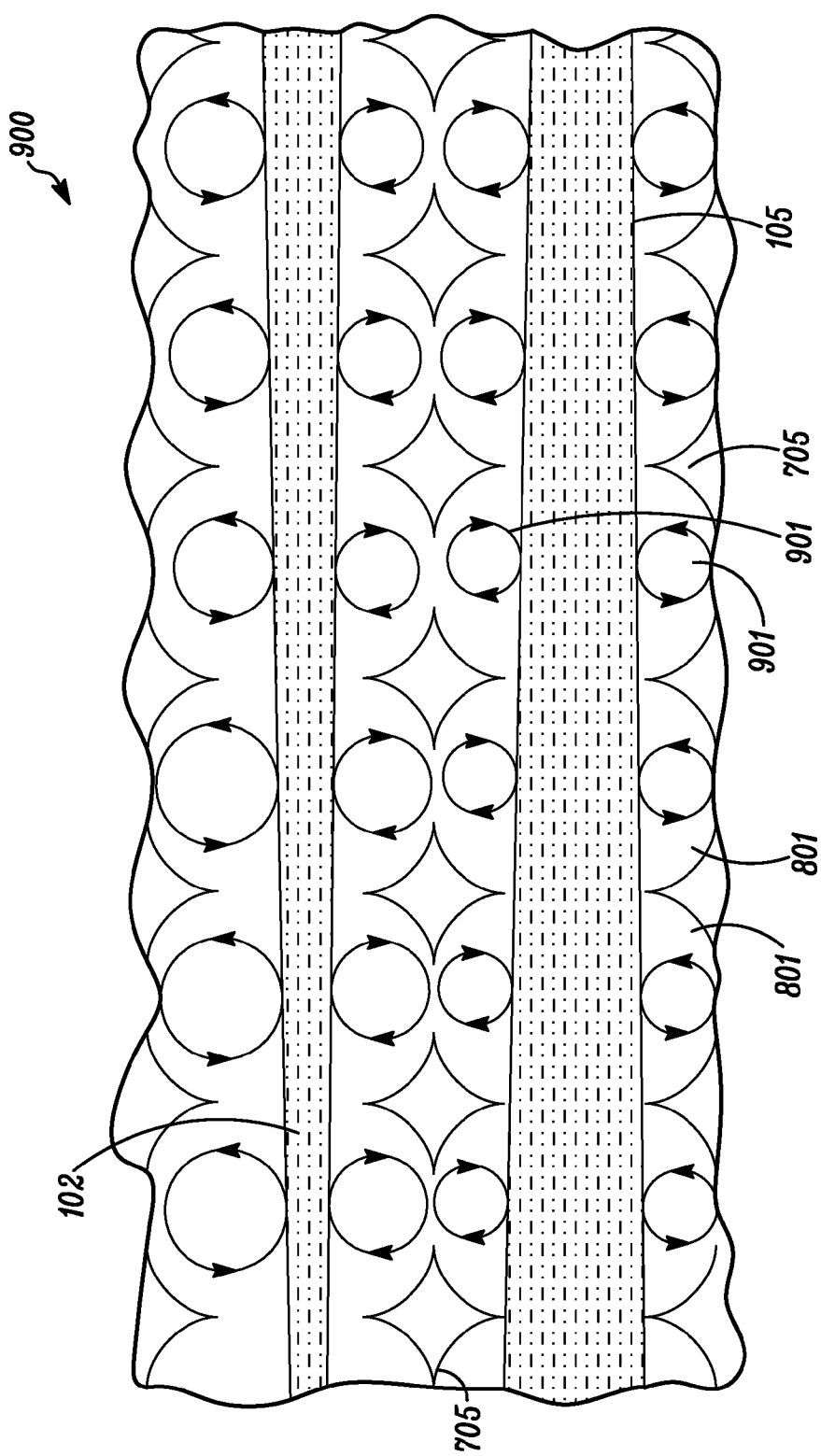
FIG. 9B is an enlarged view of a portion of the heat sink of FIG. 9A.

FIG. 9B is an enlarged view of a portion of heat sink 900 of FIG. 9A. Pin-fins 705 and dimples 801 with jets 102 and 105 may promote two vortices 901 for each dimple 801, and such vortices 901 may be disposed on opposite sides of an associated jet, such as jets 102 and 105. Such vortices 901 may originate and generally be located within their associated dimple, and may extend upwards therefrom. Furthermore, it should be appreciated that vortices 901 with larger diameters may be generated closer to an output of a nozzle for providing a jet, and such diameters of such vortices 901 may progressively get smaller with progressively increasing in width of an associated jet, such as jets 102 and 105.

Figure 10A:
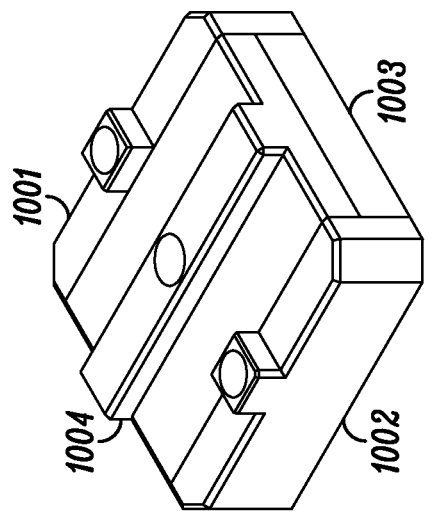
FIG. 10A is a perspective view depicting still yet another exemplary embodiment of a heat sink.

FIG. 10A is a perspective view depicting an exemplary embodiment of a heat sink 1000. Heat sink 1000 includes side plates 1001 and 1002, a base 1003, and top 1004. Heat sink 1000 may incorporate T-Collider Jets™ technology of Ecologence, LLC of Chico, Calif., as described below in additional detail.

Figure 10B:
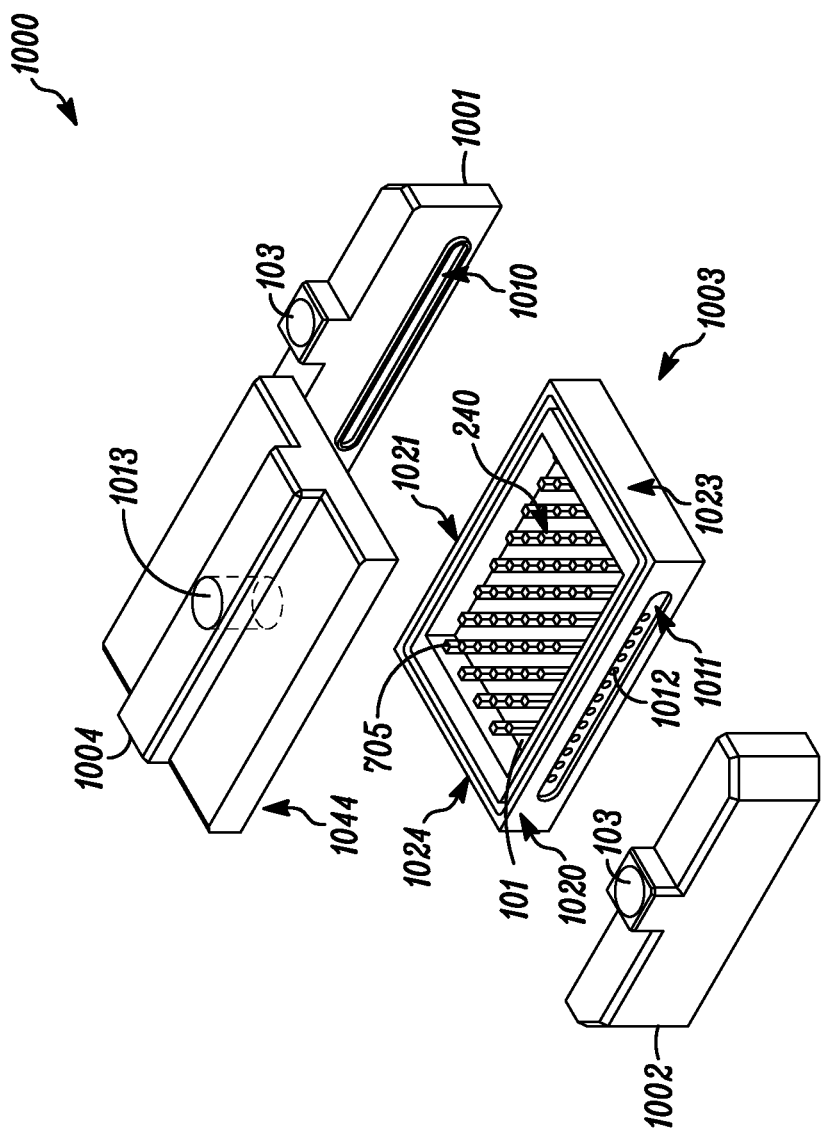
FIG. 10B is an exploded view of the heat sink of FIG. 10A.

FIG. 10B is an exploded view of heat sink 1000 of FIG. 10A. With simultaneous reference to FIGS. 10A and 10B, heat sink 1000 is further described. Side plates 1001 and 1002 each have an inlet, such as respective inlets 203 and 202. Inlets 202 and 203 extend to respective cavities as previously described, which in this exemplary embodiment are formed in two parts, namely recess 1010 of side plates 1001 and 1002 and recesses 1011 of base 1003. Even though only one of each part of a cavity is illustratively shown for opposing sides, it should be understood that there are corresponding recesses on side plate 1002 and a sidewall 1021 side of base 1003. Furthermore, it should be understood that recess 1011 may be omitted with nozzles 1012 extending to outermost surfaces of sidewalls 1020 and 1021 of base 1003.

In this exemplary embodiment, all four sidewalls 1020, 1021, 1023, and 1024 bordering chamber 240 are formed integral or contiguous with base 1003 and may support top 1004. Furthermore, a bottom surface 1044 of top 1004 is used to further define chamber 240 along with a heat dissipation surface 101 of base 1003.

Outlet 1013 extends through top 1004 into chamber 240. Thus, coolant may enter inlets 202 and 203 of side plates 1002 and 1001, respectively, and into cavities associated with recesses 1011 and 1010 for entering chamber 240 through nozzles 1012. Such coolant may exit chamber 240 via outlet 1013. Again, even though nozzles 1012 are only shown for sidewall 1020 of base 1003, it should be appreciated that nozzles 1012 are also located on an opposite side of sidewall 1021 of base 1003.

Side plates 1001 and 1002 are for engagement with corresponding outermost surfaces of sidewalls 1020 and 1021 of base 1003 for defining cavities formed by corresponding pairs of recesses 1011 and 1010. Side plates 1001 and 1002 in combination with base 1003 provide first and second manifolds which allow coolant to flow into such manifolds and out of a first and second plurality of nozzles 1012 associated with interior sides of sidewalls 1020 and 1021 of base 1003. Such manifolds are spaced apart from one another by a heat dissipation surface 101, namely an interior upper surface of base 1003 from which pin-fins 705 extend. Again, the plurality of nozzles, such as nozzles 1012 of sidewall 1020, with respect to their counterpart nozzles, such as nozzles of sidewall 1021, may be offset from one another so as to allow for an individual jet per channel as previously described. However, in a non-channelized embodiment such jets may be interlocked, as previously described. In either type embodiment or a combination of channeled and non-channeled jets, nozzles may be positioned for side-by-side flow of jets with or without channel barriers therebetween.

Nozzles 1012 of sidewall 1020 in an embodiment may be uniformly spaced apart from one another in a transverse direction with respect to the direction such nozzles are generally pointing. Likewise, nozzles in sidewall 1021 may likewise be generally uniformly spaced apart from one another though offset from nozzles 1012 of sidewall 1020. However, in other embodiments, such nozzles may not be uniformly spaced apart so as to be more tailored to a surface from which heat is to be dissipated.

Furthermore, nozzles 1012 may have same or different diameters. Such diameters may be tailored to the application, namely tailored to relative heat to be dissipated over heat dissipation surface 101, such as to promote overall isothermal cooling of such heat dissipation surface.

Figure 10C:
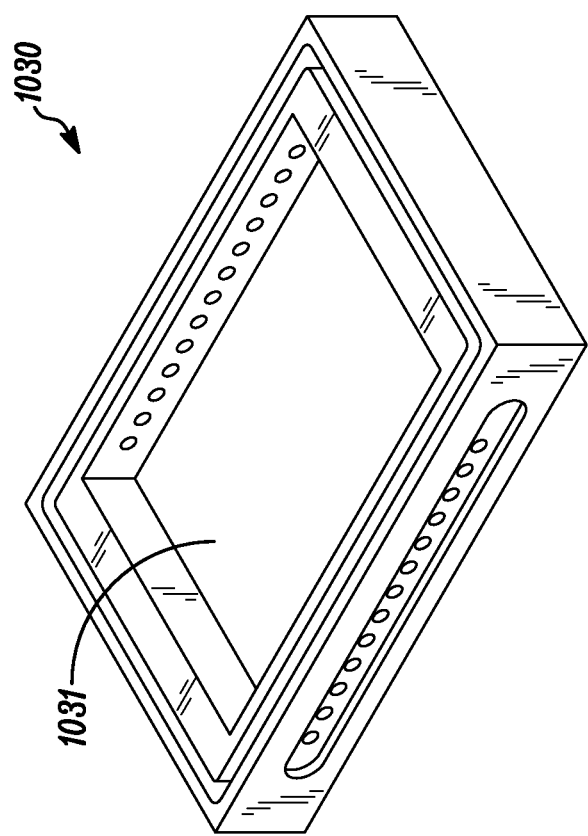
FIG. 10C is a perspective view depicting an exemplary embodiment of another base that may be used in the heat sink of FIGS. 10A and 10B.

FIG. 10C is a perspective view depicting an exemplary embodiment of another base 1030. Base 1030 may replace base 1003 in FIGS. 10A and 10B. Base 1030 has an opening 1031 for receipt of a heat dissipation surface 101, such as of object 410 of FIG. 4.

From the foregoing, it should be appreciated that cooling using offset interlocked and channelized jets has been described. It should further be understood that: (1) heat dissipation surface temperature can be restricted and temperature distribution can be at least substantially uniform for one or more steady state hot spots of such heat dissipation surface and/or for one or more "wandering" hot spots of such heat dissipation surface; (2) a high, if not highest, Critical Heat Flux ("CHF") may be achieved using organized hydrodynamics provided by side-to-side jets, including without limitation side-to-side collided jets; and/or (3) a heat dissipation surface may not be as damaged, if at all, by jets streaming along such heat dissipation surface in contrast to jets directed more or less perpendicular to such heat dissipation surface, the latter of which may be more erosive of such heat dissipation surface.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for dissipating heat from a heat dissipation surface, comprising:
   providing a first plurality of jets streaming along the heat dissipation surface in a first direction and spaced apart from one another;
   providing a second plurality of jets streaming along the heat dissipation surface in a second direction at least substantially opposite the first direction and spaced apart from one another; and
   exiting coolant used to provide the first plurality of jets and the second plurality of jets away from the heat dissipation surface;
   wherein the first plurality of jets and the second plurality of jets are offset from one another in a transverse direction with respect to the first direction and the second direction; and
   wherein the first plurality of jets and the second plurality of jets pass side-by-side with respect to one another.

2. The method according to claim 1, wherein the coolant used to provide the first plurality of jets and the second plurality of jets is a liquid.

3. The method according to claim 1, wherein the coolant used to provide the first plurality of jets and the second plurality of jets is a gas.

4. The method according to claim 1, wherein the coolant used to provide the first plurality of jets and the second plurality of jets is a gas-liquid mixture.

5. The method according to claim 1, wherein the coolant used to provide the first plurality of jets and the second plurality of jets is a dielectric liquid.

6. The method according to claim 1, wherein at least one jet of either or both of the first plurality of jets and the second plurality of jets is inclined toward the heat dissipation surface for contact therewith.

7. The method according to claim 1, wherein the first plurality of jets are interlocked with the second plurality of jets.

8. The method according to claim 1, wherein the first plurality of jets and the second plurality of jets are channelized.

9. The method according to claim 1, wherein a jet of the first plurality of jets and a jet of the second plurality of jets collide side-to-side with one another.

10. The method according to claim 1, wherein:
    the heat dissipation surface is submerged under the coolant; and
    the first plurality of jets and the second plurality of jets are projected as submerged into the coolant.

11. The method according to claim 1, further comprising:
    providing a first manifold having a first plurality of nozzles and a second manifold having a second plurality of nozzles;
    flowing the coolant into the first manifold and the second manifold;
    the first manifold spaced apart from the second manifold by and located at opposing sides of the heat dissipation surface; and
    projecting the coolant out of the first plurality of nozzles of the first manifold in the first direction and the second plurality of nozzles of the second manifold in the second direction to provide the first plurality of jets and the second plurality of jets, respectively.

12. The method according to claim 11, wherein the first plurality of jets and the second plurality of jets in combination define a plane that is above the heat dissipation surface.

13. The method according to claim 11, wherein the first plurality of jets correspond in number to the second plurality of jets to provide pairs of alternate jets.

14. The method according to claim 11, wherein:
    the first plurality of nozzles are at least substantially uniformly spaced apart from one another in the transverse direction; and
    the second plurality of nozzles are at least substantially uniformly spaced apart from one another in the transverse direction.

15. The method according to claim 11, wherein the first plurality of nozzles and the second plurality of nozzles have different diameters for cooling locations on the heat dissipation surface at different rates.

16. The method according to claim 11, wherein the first manifold and the second manifold are parts of a heat sink.

17. An apparatus for dissipating heat, comprising:
    a heat sink defining a chamber;
    the heat sink having a base, a top, a first sidewall, a second sidewall, a third sidewall, and a fourth sidewall all having surfaces bordering the chamber;
    the first sidewall having a first inlet, a first cavity, and first nozzles;
    the first inlet extending through a portion of the first sidewall to the first cavity for passage of coolant;
    the first nozzles extending through another portion of the first sidewall from the first cavity for jetting out the coolant from the first nozzles into the chamber;
    the second sidewall having a second inlet, a second cavity, and second nozzles;
    the second inlet extending through a portion of the second sidewall to the second cavity for passage of the coolant;
    the second nozzles, offset from the first nozzles in a transverse direction, extending through another portion of the second sidewall from the second cavity for jetting out the coolant from the second nozzles into the chamber;
    the base, associated with the first sidewall, the second sidewall, the third sidewall, and the fourth sidewall, having a heat transfer surface at a bottom of the chamber from which the heat is to be dissipated during operation;

the top, associated with the first sidewall, the second sidewall, the third sidewall, and the fourth sidewall, having an outlet for passage of the coolant out of the chamber; and an underside of the base to conduct the heat to the coolant in the chamber of the heat sink via the heat transfer surface of the base.

18. The apparatus according to claim 17, wherein:

the first sidewall and the second sidewall face one another;

the first nozzles and the second nozzles are pointed in different directions at least substantially opposite one another; and the first nozzles and the second nozzles are offset from one another in the transverse direction to the surfaces of the first sidewall and the second sidewall facing one another for providing jets that pass side-by-side with respect to one another and along the heat transfer surface during operation.

19. The apparatus according to claim 18, wherein a jet from each of the first nozzles and the second nozzles is pointed at the heat transfer surface.

20. The apparatus according to claim 18, wherein the first nozzles alternate with the second nozzles along the first sidewall and the second sidewall, respectively, for providing pairs of interdigitated jets alternatively directed during operation.

21. The apparatus according to claim 18, further comprising:

third nozzles formed through the other portion of the first sidewall from the first cavity for jetting out the coolant from the third nozzles into the chamber;

wherein the third nozzles correspond to and are pointed opposite the second nozzles;

fourth nozzles formed through the other portion of the second sidewall from the second cavity for jetting out the coolant from the fourth nozzles into the chamber;

wherein the fourth nozzles correspond to and are pointed opposite the first nozzles; and wherein the third nozzles and the fourth nozzles are for jetting out the coolant short distances in comparison to the second nozzles and the first nozzles, respectively.

22. The apparatus according to claim 17, wherein the heat transfer surface of the base has dimples.

23. The apparatus according to claim 17, wherein the heat transfer surface of the base has pin-fins extending upwardly therefrom into the chamber.

24. The apparatus according to claim 23, wherein:

the pin-fins define channels; and the first nozzles and the second nozzles are pointed into the channels.

25. The apparatus according to claim 24, wherein the first nozzles and the second nozzles are pointed to emit within corresponding ones of the channels.

26. A system, comprising:

the apparatus according to claim 17; and an electronic device having a heat dissipation surface coupled to the underside of the base for thermal conduction.

27. The system according to claim 26 further comprising a pump coupled to the first inlet and the second inlet for pumping the coolant into and out of the heat sink.

28. An apparatus for dissipating heat, comprising:

a heat sink defining a region;

the heat sink having a base, a first sidewall, a second sidewall, a third sidewall, and a fourth sidewall all having surfaces bordering the region;

the first sidewall having a first inlet, a first cavity, and first nozzles;

the first inlet extending through a portion of the first sidewall to the first cavity for passage of coolant;

the first nozzles extending through another portion of the first sidewall from the first cavity for jetting out the coolant from the first nozzles into the region;

the second sidewall having a second inlet, a second cavity, and second nozzles;

the second inlet extending through a portion of the second sidewall to the second cavity for passage of the coolant;

the second nozzles, offset from the first nozzles in a transverse direction, extending through another portion of the second sidewall from the second cavity for jetting out the coolant from the second nozzles into the region; and the base, associated with the first sidewall, the second sidewall, the third sidewall, and the fourth sidewall, having an opening for receipt of a heat dissipation surface.

29. A system, comprising:

the apparatus of claim 28; and a device having the heat dissipation surface and coupled to the apparatus for having the heat dissipation surface in the opening.

30. The apparatus according to claim 28, wherein:

the first sidewall and the second sidewall face one another;

the first nozzles and the second nozzles are pointed in different directions at least substantially opposite one another; and the first nozzles and the second nozzles are offset from one another in the transverse direction to the surfaces of the first sidewall and the second sidewall facing one another for providing jets that pass side-by-side with respect to one another and along the heat transfer surface during operation.

31. An apparatus for dissipating heat, comprising:

a heat sink defining a region;

the heat sink having a first sidewall and a second sidewall bordering the region;

the first sidewall having a first cavity and having first nozzles formed through a portion of the first sidewall to the first cavity for passage of coolant from the first cavity for jetting out from the first nozzles into the region;

the second sidewall having a second cavity and having second nozzles formed through a portion of the second sidewall to the second cavity for passage of the coolant from the second cavity for jetting out from the second nozzles into the region; and a heat dissipation surface located at the bottom of the region;

wherein the first sidewall and the second sidewall face one another;

wherein the first nozzles and the second nozzles are pointed in different directions at least substantially opposite one another; and wherein the first nozzles and the second nozzles are offset from one another in a transverse direction to facing surfaces of the first sidewall and the second sidewall for providing interlocked jets along the heat dissipation surface during operation.

* * * * *